United States Patent
Fuse

(10) Patent No.: US 6,979,870 B2
(45) Date of Patent: Dec. 27, 2005

(54) SEMICONDUCTOR INTEGRATED CIRCUIT INCLUDING CMOS LOGIC GATE

(75) Inventor: Tsuneaki Fuse, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/452,284

(22) Filed: Jun. 3, 2003

(65) Prior Publication Data

US 2004/0203196 A1 Oct. 14, 2004

(30) Foreign Application Priority Data

Apr. 9, 2003 (JP) ............................. 2003-105301

(51) Int. Cl.⁷ ............................................. H01L 31/062
(52) U.S. Cl. ....................... 257/371; 257/678; 365/156
(58) Field of Search ................................ 257/133, 139, 257/321, 327, 328, 329, 330, 341, 346, 376, 257/401, 409, 678, 706, E29.026, E29.027, 257/E29.066, E29.198, 371; 327/565; 365/156

(56) References Cited

U.S. PATENT DOCUMENTS 5,072,286 A * 12/1991 Minami et al. ............. 257/208
5,444,275 A * 8/1995 Kugishima et al. ......... 257/206

FOREIGN PATENT DOCUMENTS

JP 10-275914 10/1998

OTHER PUBLICATIONS

Hsindao Lu, et al., "A 1-M Bit SRAM on Simox Material", Prodeedings 1993 IEEE International SOI Conference, 1993, pp. 182-183.
Kouichi Kumagai, et al., "A New SRAM Cell Design Using 0.35 μm CMOS/SIMOX Technology", Proceedings 1997 IEEE International SOI Conference, Oct. 1997, pp. 174-175.
Jon M. Stern, et al., "Silicon-on-Insulator (SOI): A High Performance ASIC Technology", IEEE 1992 Custom Integrated Circuits Conference, 1992 pp. 9.2.1-9.2.4.
Nobutaro Shibata, et al., "A 2-V 300-MHz 1-Mb Current-Sensed Double-Density SRAM for Low-Power 0.3-μm CMOS/SIMOX ASICs", IEEE Journal of Solid-State Circuits, vol. 36, No. 10, 2001, pp. 1524-1537.
U.S. Appl. No. 10/452,284, filed Jun. 3, 2003, Fuse.
U.S. Appl. No. 10/914,128, filed Aug. 10, 2004, Ohta et al.

* cited by examiner

Primary Examiner—Minhloan Tran
Assistant Examiner—Thomas L. Dickey
(74) Attorney, Agent, or Firm—Oblon, Spivak, McClelland, Maier & Neustadt, P.C.

(57) ABSTRACT

A semiconductor integrated circuit of an aspect of the present invention having a CMOS logic gate including a first MOS transistor of a first conductivity type and a second MOS transistor of a second conductivity type, has a first MOS transistor region in which the first MOS transistor is formed, and a 2ath MOS transistor region and a 2bth MOS transistor region, in each of which the second MOS transistor is formed, separately arranged to be in contact with a first side of said first MOS transistor region and a second side opposite to the first side.

5 Claims, 13 Drawing Sheets

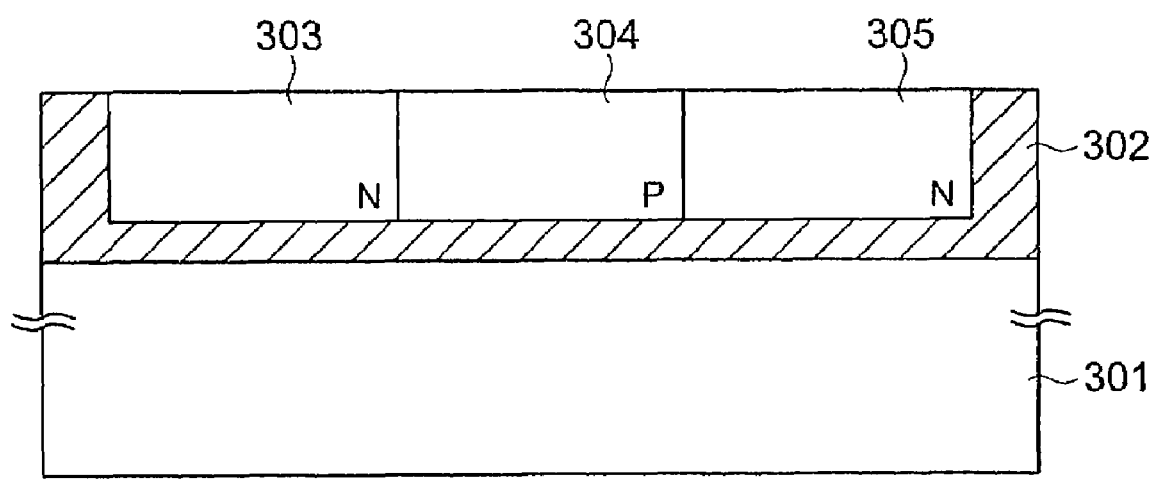
F I G. 2

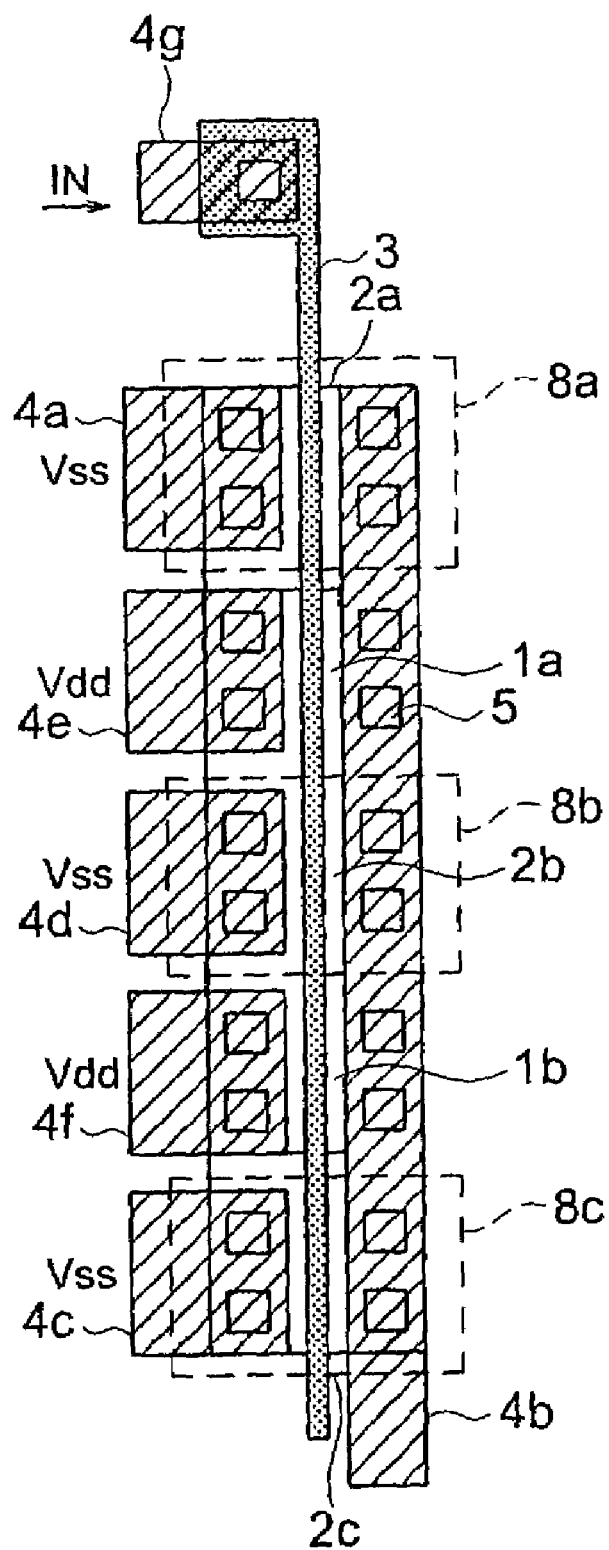
F I G. 10

SEMICONDUCTOR INTEGRATED CIRCUIT INCLUDING CMOS LOGIC GATE

CROSS REFERENCE TO RELATED APPLICATION

This application is based upon and claims benefit of priority under 35 USC 119 from the Japanese Patent Application No. 2003-105301, filed on Apr. 9, 2003, the entire contents of which are incorporated herein by reference.

BACKGROUND OF THE INVENTION

The present invention relates to a semiconductor integrated circuit.

Recently, along with the miniaturization of devices, the integration density of semiconductor integrated circuits has increased. Semiconductor integrated circuits often use CMOS circuits that can realize low-power logic circuits with a relatively small number of devices. A CMOS circuit is constituted by a combination of MOS transistors of the first conductivity type (e.g., PMOS transistors) and MOS transistors of the second conductivity type (e.g., NMOS transistors).

FIG. 11 shows an example of a conventional planar layout that realizes an inverter serving as a basic gate in a CMOS circuit. A PMOS transistor region 101 and NMOS transistor region 102 are arranged on a surface portion of a semiconductor substrate. A gate electrode 103 made of a polysilicon film or the like extends across both the channel regions of the regions 101 and 102.

The following wirings are formed on the source and drain regions of the regions 101 and 102 through an interlayer dielectric film (not shown): a wiring 104a for connecting the source of a PMOS transistor to a power supply voltage Vdd terminal, a wiring 104b for outputting a signal OUT from the drains of PMOS and NMOS transistors, a wiring 104c for connecting the source of the NMOS transistor to a ground voltage Vss terminal, and a wiring 104d for inputting a signal IN to the gate electrode 103.

The respective source or drain impurity diffusion layers are connected to the wirings 104a to 104d through contact holes 105 formed in the interlayer dielectric film.

A well boundary 107 exists to isolate the conductivity types of the PMOS transistor region 101 and NMOS transistor region 102. The inside of a region 108 enclosed with the dotted line is a region ion-implanted with an N-type impurity. The outside of the region 108 is a region ion-implanted with a P-type impurity.

In the inverter having this arrangement, the source side of the PMOS transistor region 101 is connected to the power supply voltage Vdd terminal, the source side of the NMOS transistor is connected to the ground potential Vss terminal, a signal IN100 is input to the gate electrode 103 of the PMOS and NMOS transistors, and the signal OUT is output from the drain side of the PMOS and NMOS transistors.

FIG. 12 shows the circuit arrangement of a NAND circuit based on a CMOS arrangement. This circuit uses PMOS transistors 1201 and 1202 and NMOS transistors 1203 and 1204. A signal IN1 is input to the gates of the PMOS transistor 1201 and NMOS transistor 1204. A signal IN2 is input to the gates of the PMOS transistor 1202 and NMOS transistor 1203. The signal OUT is output from the drains of the PMOS transistors 1201 and 1202.

FIG. 13 shows an example of a conventional layout that realizes this NAND circuit.

PMOS transistor regions 201 and 202 are formed, and gate electrodes 203a and 203b are formed on the channel regions of the respective transistor regions through a gate insulating film.

NMOS transistor regions 204 and 203 are formed, and the gate electrodes 203a and 203b extend on the channel regions of the respective transistor regions.

A power supply voltage Vdd line 204a and ground voltage Vss line 204b are arranged on the upper and lower sides along one direction in FIG. 13. Wirings 204d and 204e are provided on the source regions of the PMOS transistor regions 201 and 202, and both are connected to the power supply voltage Vdd line 204a. A wiring 204f is commonly formed on the drain regions of the PMOS transistor regions 201 and 202, and extends on the drain region of the NMOS transistor 203. A wiring 204g formed on the source region of the NMOS transistor 204 is connected to the ground voltage Vss line 204b.

Note that the following are references that disclose conventional techniques:

reference 1: U.S. Ser. No. 2001/0019162
reference 2: U.S. Pat. No. 6,114,903
reference 3: Japanese Patent Laid-Open No. 05-259398
reference 4: Japanese Patent Laid-Open No. 07-130971

The following problems are, however, posed in the conventional semiconductor integrated circuits.

A distance 109 exists between the PMOS transistor region 101 and the NMOS transistor region 102 shown in FIG. 11. Likewise, a distance 209 exists between the PMOS transistor region 201 and the NMOS transistor region 204 shown in FIG. 13. For example, the distance 109 is determined from the sum of the distance required from the PMOS transistor region 101 to a well boundary 107 and the distance required from the NMOS transistor region 102 to the well boundary 107.

A PN junction is formed on the well boundary 107 by bringing an N-type impurity diffusion layer on which the PMOS transistor region 101 is formed into contact with a P-type impurity diffusion layer on which the NMOS transistor region 102 is formed.

Both the P- and N-type impurity profiles are not constant near the well boundary 107 to result in a density gradient. When the well boundary 107 and the channel region of each transistor come so close to each other as to be affected by the density gradient, the electrical characteristics of each transistor deteriorate. Therefore, this distance must be set to prevent the influence on transistor characteristics.

In addition, a PNPN thyristor structure is formed between a P-type source/drain region in the PMOS transistor region 101, an N-type impurity diffusion layer on which a PMOS transistor is formed, a P-type impurity diffusion layer on which an NMOS transistor is formed, and an N-type source/drain region in the NMOS transistor region 102.

Bringing the source/drain region of a transistor too close to the well boundary 107 will raise a condition for the operation of this thyristor. As a consequence, latchup occurs. That is, a current always flows from the source region of the PMOS transistor to which a power supply voltage Vdd is applied to the source region of the NMOS transistor to which a ground potential Vss is applied. This causes a circuit operation failure.

In a CMOS circuit, therefore, in order to prevent latchup, the PMOS transistor region 101 must be separated from the NMOS transistor region 102. This has been a bottleneck for higher integration density. This situation also applies to the NAND circuit shown in FIG. 13.

SUMMARY OF THE INVENTION

A semiconductor integrated circuit, according to one aspect of the present invention, having a CMOS logic gate including a first MOS transistor of a first conductivity type and a second MOS transistor of a second conductivity type, comprises a first MOS transistor region in which the first MOS transistor is formed, and a 2ath MOS transistor region and a 2bth MOS transistor region, in each of which the second MOS transistor is formed, separately arranged to be in contact with a first side of said first MOS transistor region and a second side opposite to the first side.

A semiconductor integrated circuit according to one aspect of the present invention, having a CMOS logic gate including a first MOS transistor of a first conductivity type and a second MOS transistor of a second conductivity type, comprises a first MOS transistor region in which the first MOS transistor is formed, and a 2ath MOS transistor region in which the second MOS transistor is formed and which is placed such that a first side is in contact with a first side of said first MOS transistor region, and a 2bth MOS transistor region which is placed such that a first side is in contact with a second side opposite to the first side of said first MOS transistor region, and a 3ath MOS transistor region in which the first MOS transistor is formed and which is placed such that a first side is in contact with a second side opposite to the first side of said 2ath MOS transistor region, and a 3bth MOS transistor region which is placed such that one side is in contact with a second side opposite to the first side of said 2bth MOS transistor region.

A semiconductor integrated circuit according to one aspect of the present invention, having a NAND gate including first and second MOS transistors of a first conductivity type and third and fourth MOS transistors of a second conductivity type, comprises a first MOS transistor region in which the first MOS transistor is formed, a 3ath MOS transistor and a 3bth MOS transistor, in each of which the third MOS transistor is formed, separately arranged to be in contact with a first side of said first MOS transistor region and a second side opposite to the first side, respectively, a second MOS transistor region in which the second MOS transistor is formed and which is placed to be in contact with a third side perpendicular to the first side of said MOS transistor region and the second side opposite to the first side, and a 4ath MOS transistor region and a 4bth MOS transistor region, in each of which the fourth MOS transistor is formed, separately arranged to be in contact with first and second sides of said second MOS transistor region, respectively, wherein the first side of a source region in said first MOS transistor region is in contact with one side of a source region in said 3ath MOS transistor region, the second side of the source region in said first MOS transistor region is in contact with one side of a source region in said 3bth MOS transistor region, the first side of a drain region in said first MOS transistor region is in contact with one side of a drain region in said 3ath MOS transistor region, the second side of the drain region in said first MOS transistor region is in contact with one side of a drain region in said 3bth MOS transistor region, the first side of a source region in said second MOS transistor region is in contact with one side of a source region in said 4ath MOS transistor region, the second side of the source region in said second MOS transistor region is in contact with one side of a source region in said 4bth MOS transistor region, the first side of a drain region in said second MOS transistor region is in contact with one side of a drain region in said 4ath MOS transistor region, the second side of the drain region in said second MOS transistor region is in contact with one side of a drain region in said 4bth MOS transistor region, a first gate electrode extends above said 3ath MOS transistor region, said first MOS transistor region, and said 3bth MOS transistor region through a gate oxide film, and a second gate electrode extends above said 4ath MOS transistor region, said second MOS transistor region, and said 4bth MOS transistor region through the gate oxide film.

A semiconductor integrated circuit according to one aspect of the present invention, having a NAND gate including first and second MOS transistors of a first conductivity type and third and fourth MOS transistors of a second conductivity type, and an inverter including a fifth MOS transistor of the first conductivity type and a sixth MOS transistor of the second conductivity type and having an input terminal connected to an output terminal of the NAND gate, comprises a first MOS transistor region in which the first MOS transistor is formed, a 3ath MOS transistor and a 3bth MOS transistor, in each of which the third MOS transistor is formed, separately arranged to be in contact with a first side of said first MOS transistor region and a second side opposite to the first side, respectively, a second MOS transistor region in which the second MOS transistor is formed and which is placed to be in contact with a third side perpendicular to the first and second sides of said first MOS transistor region, a 4ath MOS transistor region and a 4bth MOS transistor region, in each of which the fourth MOS transistor is formed, separately arranged to be in contact with a first side of said second MOS transistor region and a second side opposite to the first side, respectively, a fifth MOS transistor region in which the fifth MOS transistor is formed and which is placed to be in contact with a fourth side perpendicular to first and second sides of said second MOS transistor region, and a sixth transistor region in which the sixth MOS transistor is formed, wherein the first side of a source in said first MOS transistor region is in contact with one side of a source region in said 3ath MOS transistor region, the second side of the source region in said first MOS transistor region is in contact with one side of a source region in said 3bth MOS transistor region, the first side of a drain region in said first MOS transistor region is in contact with one side of a drain region in said 3ath MOS transistor region, the second side of the drain region in said first MOS transistor region is in contact with one side of a drain region in said 3bth MOS transistor region, the first side of a source region in said second MOS transistor region is in contact with one side of a source region in said 4ath MOS transistor region, the second side of the source region in said second MOS transistor region is in contact with one side of a source region in said 4bth MOS transistor region, the first side of a drain region in said second MOS transistor region is in contact with one side of a drain region in said 4ath MOS transistor region, the second side of the drain region in said second MOS transistor region is in contact with one side of a drain region in said 4bth MOS transistor region, a third side perpendicular to the first and second sides of the source region in said second MOS transistor region is in contact with one side of a source region in said fifth MOS transistor region, a first gate electrode extends above said 3ath MOS transistor region, said first MOS transistor region, and said 3bth MOS transistor region through a gate oxide film, a second gate electrode extends above said 4ath MOS transistor region, said second MOS transistor region, and said 4bth MOS transistor region through the gate oxide film, and a third gate electrode is placed above said fifth MOS transistor region through the gate insulating film, a fourth gate electrode is placed above said sixth MOS transistor region through the gate insulating film, and the third gate electrode is electrically connected to the fourth gate electrode.

A semiconductor integrated circuit according to one aspect of the present invention, having a NAND gate including first and second MOS transistors of a first conductivity type and third and fourth MOS transistors of a second conductivity type, comprises a first MOS transistor region in which the first MOS transistor is formed, a second MOS transistor region in which the second MOS transistor is formed and which is placed such that a source region is in contact with a source region in said first MOS transistor, a third MOS transistor region in which the third MOS transistor is formed and which is placed such that a drain region is in contact with a drain region in said second MOS transistor, and a fourth MOS transistor region in which the fourth MOS transistor is formed and which is placed such that a drain region is in contact with a source region in said third MOS transistor, wherein a first gate electrode is placed above said first MOS transistor region through a gate oxide film, a second gate electrode is placed above said second MOS transistor region through the gate oxide film, a third gate electrode electrically connected to the first gate electrode is placed above said third MOS transistor region through the gate oxide film, and a fourth gate electrode electrically connected to the second gate electrode is placed above said fourth MOS transistor region through the gate oxide film.

BRIEF DESCRIPTION OF THE DRAWINGS

FIG. 2 is a longitudinal sectional view showing the arrangement of an SOI substrate used in the embodiment of the present invention;

FIG. 10 is a plan view showing a layout of a semiconductor integrated circuit according to a modification of the above embodiment of the present invention;

DESCRIPTION OF THE PREFERRED EMBODIMENTS

The embodiments of the present invention will be described below with reference to the accompanying drawings.

(1) First Embodiment

Figure 1:
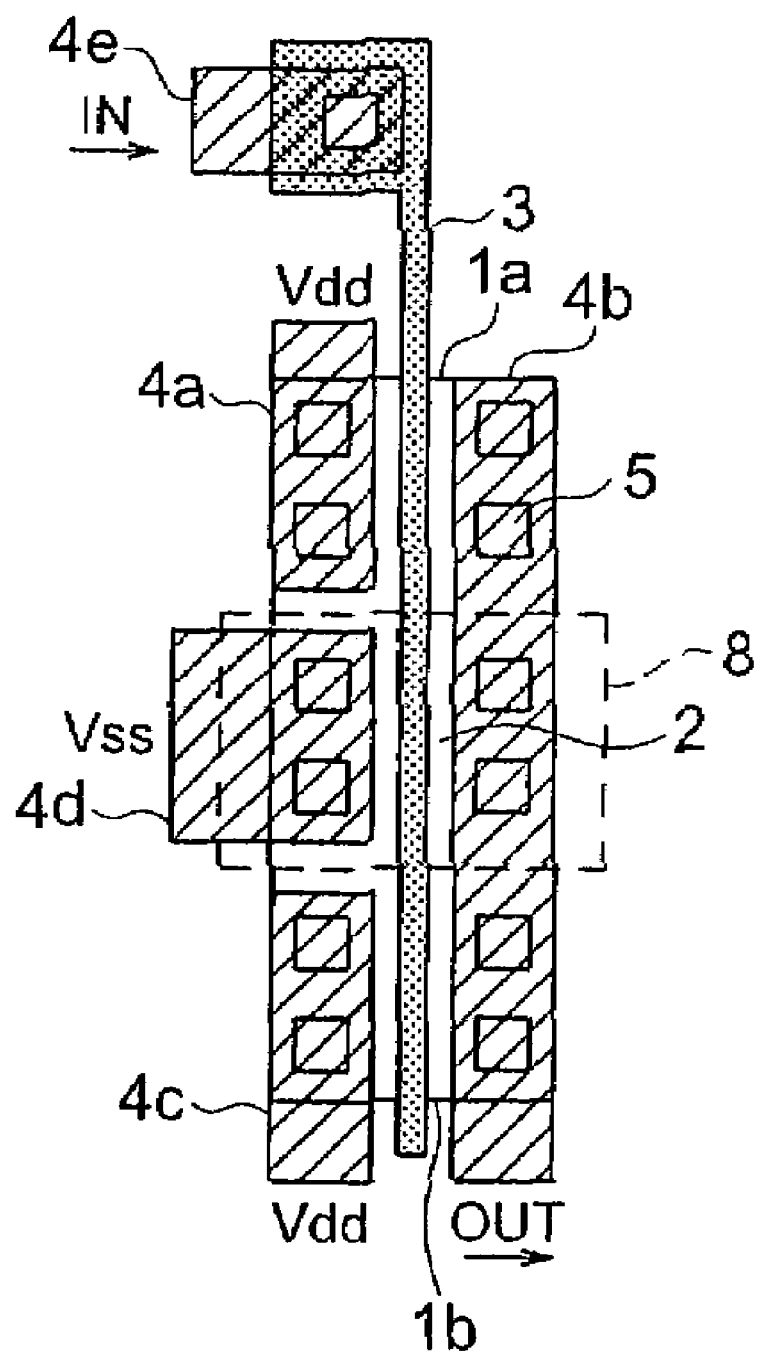
FIG. 1 is a plan view showing a layout of an inverter as a semiconductor integrated circuit according to the first embodiment of the present invention.

FIG. 1 shows a planar layout of a CMOS inverter circuit as a semiconductor integrated circuit according to the first embodiment of the present invention.

PMOS transistor regions 1a and 1b and an NMOS transistor region 2 are arranged on a surface portion of a semiconductor substrate. An N-type impurity is ion-implanted in a substantially middle portion of the overall transistor region to form an N-type impurity region 8. A P-type impurity is ion-implanted in the remaining regions to form P-type impurity regions. The PMOS transistor regions 1a and 1b in which a P-type impurity is implanted are separately formed at the upper and lower ends of the NMOS transistor region 2 in the N-type impurity region 8, as shown in FIG. 1.

The source regions and drain regions of the PMOS transistor regions 1a and 1b and NMOS transistor region 2 are in direct contact with each other without having any isolation regions therebetween. In addition, a gate electrode 3 extends on the channel regions of the respective transistor regions 1a, 1b, and 2 through a gate insulating film (not shown).

In the prior art, as described with reference to FIG. 10, in order to prevent phenomena such as latchup, it is necessary to ensure the distance 109 determined by the sum of the distance required from the PMOS transistor region 101 to the well boundary 107 and the distance required from the NMOS transistor region 102 to the well boundary 107. This has hindered an increase in integration density. According to this embodiment, no such well boundary exists, and hence the integration density can be increased.

More specifically, the drain region of the PMOS transistor region 1a and the drain region of the NMOS transistor region 2, which are connected to each other through a wiring 4b, are in direct contact with each other without being isolated from each other by isolation.

The region where the ion of the N-type impurity is implanted is determined by using a photomask having the same shape as that of the region 8. The position of this mask is set in accordance with the overall element region.

Depending on the mask alignment precision and a manufacturing process, shift from a desired position occurs. Even if the position of the region 8 shifts, no change occurs in gate width in the NMOS transistor region 2. In addition, since the PMOS transistor regions 1a and 1b are arranged on the upper and lower sides of the PMOS transistor region 2, even if the region 2 shifts vertically, no change occurs in the sum of gate widths in the two NMOS transistor regions 1a and 1b. Even misalignment of the mask therefore has no influence on the transistor characteristics.

Each transistor in this embodiment and the remaining embodiments to be described below is preferably an SOI (Silicon On Insulator) substrate on which element regions (an N-type impurity diffusion layer 303, P-type impurity diffusion layer 304, and N-type impurity diffusion layer 305)

are formed on a semiconductor substrate 301 through an insulating film 302, as shown in FIG. 2. This is because an SOI substrate requires no well region, and hence isolation between a PMOS transistor and an NMOS transistor is not determined by the distances between the transistors and a well boundary, as described with reference to FIGS. 10 and 12.

In the first embodiment, the PMOS transistor regions 1a and 1b are separately arranged on the upper and lower sides of the NMOS transistor region 2. In contrast to this, NMOS transistor regions may be separately arranged on the upper and lower sides of a PMOS transistor.

In addition, in the first embodiment described above, the single impurity diffusion layer 2 is formed in almost the middle of one element region. However, a plurality of such impurity diffusion layers may be formed. For example, two N-type impurity diffusion layers may be formed, and three P-type impurity diffusion layers may be separately formed between the N-type impurity diffusion layers and on the upper and lower sides thereof, thereby arranging a PMOS transistor region, NMOS transistor region, PMOS transistor region, NMOS transistor region, and PMOS transistor region along the vertical direction.

(2) Second Embodiment

A semiconductor integrated circuit according to the second embodiment of the present invention will be described with reference to FIG. 3.

This embodiment is equivalent to an application of the inverter circuit according to the first embodiment to a standard cell. The same reference numerals as in the first embodiment denote the same parts in the second embodiment, and a description thereof will be omitted.

In a cell region 12 enclosed with the chain line, the inverter circuit according to the first embodiment, a power supply voltage Vdd terminal 4e, and a ground voltage Vss terminal 4f are arranged. A wiring 4a on the source region of a PMOS transistor region 1a so extends as to be connected to the power supply voltage Vdd terminal 4e. A wiring 4d on the source region of an NMOS transistor region 2 so extends as to be connected to the ground voltage Vss terminal 4f.

Figure 3:
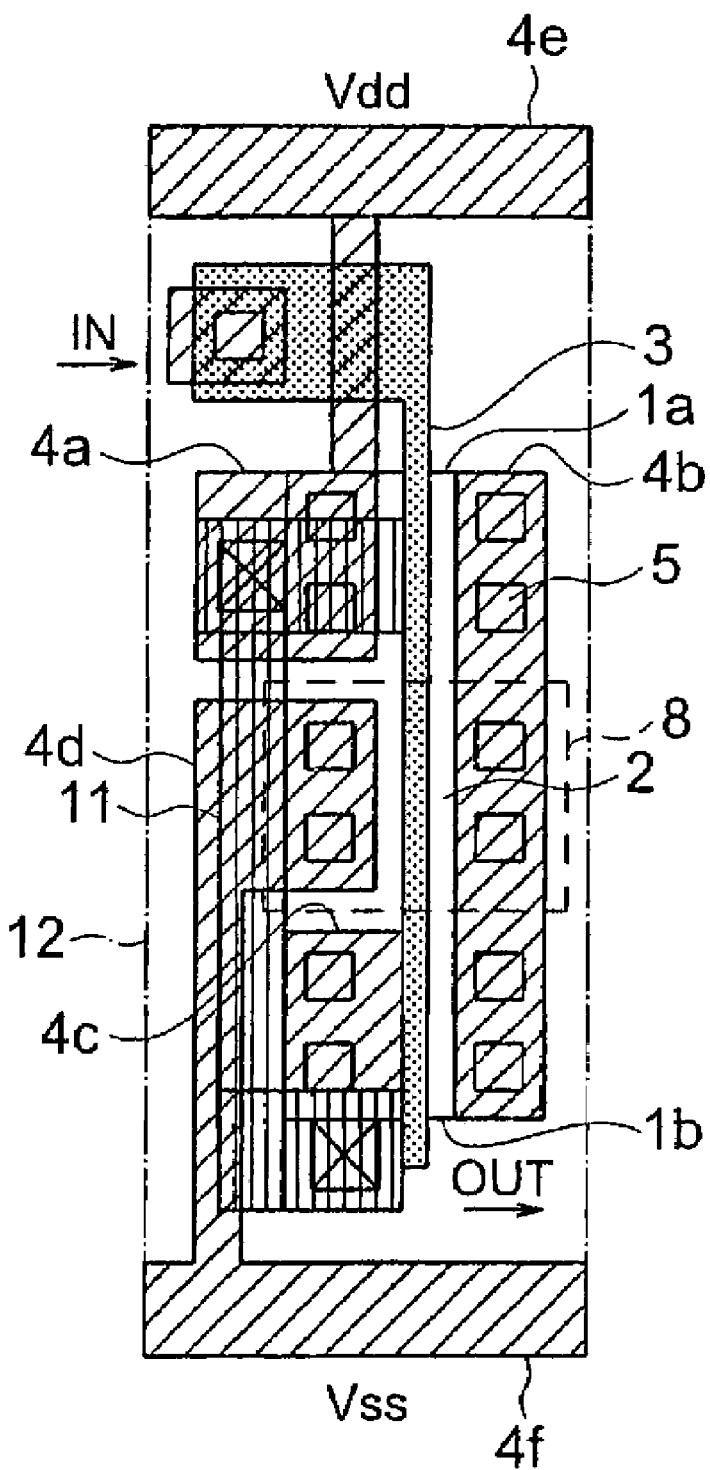
FIG. 3 is a plan view showing a layout of an inverter as a semiconductor integrated circuit according to the second embodiment of the present invention.

Such standard cells are arranged in the form of an array in the horizontal direction in FIG. 3, and are connected to each other through the power supply voltage Vdd terminal 4e and ground voltage Vss terminal 4f.

In this embodiment, as in the first embodiment, even if mask misalignment occurs at the position of the region 8, since no change occurs in the gate width of the NMOS transistor region 2 and the sum of the gate widths of the PMOS transistor regions 1a and 1b, the integration density can be increased without degradation in transistor characteristics.

(3) Third Embodiment

Figure 4:
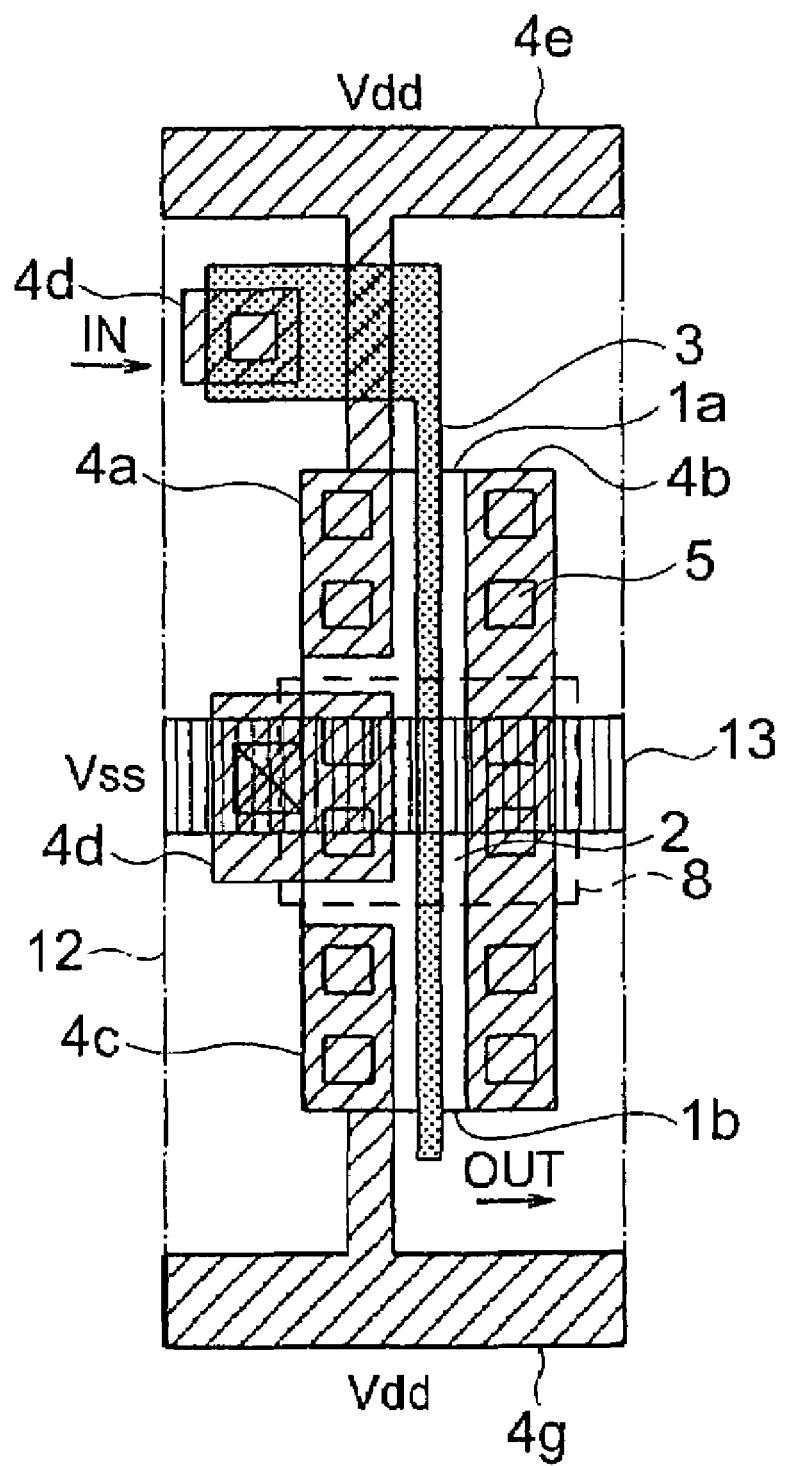
FIG. 4 is a plan view showing a layout of an inverter as a semiconductor integrated circuit according to the third embodiment of the present invention.

The third embodiment of the present invention has the arrangement shown in FIG. 4, and differs from the second embodiment described above in the layout of a power supply voltage Vdd line and ground voltage Vss line. The same reference numerals as in the second embodiment denote the same parts in the third embodiment, and a description thereof will be omitted.

In a cell region 12, power supply voltage Vdd lines 4e and 4g extend on the upper and lower ends along the horizontal direction in FIG. 4. A ground voltage Vss line 13 extends in almost the middle of the cell region 12 in the horizontal direction.

In the arrangement of this inverter circuit, since PMOS transistor regions 1a and 1b are arranged on the upper and lower sides, wirings 4a and 4c on the source regions of the PMOS transistor regions 1a and 1b can be easily connected to the power supply voltage Vdd lines 4e and 4g arranged on the upper and lower sides. The source region of an NMOS transistor region 2 placed in almost the middle of the arrangement can be easily connected to the ground voltage Vss line 13 placed above the source region.

As described above, this embodiment facilitates connection between the PMOS transistor and NMOS transistor and the power supply voltage Vdd lines 4e and 4g and ground voltage Vss, line 13, and can reduce the area of the wirings for connection.

(4) Fourth Embodiment

The fourth embodiment of the present invention will be described with reference to FIG. 5. This embodiment is equivalent to an arrangement in which the transistor regions in the second and third embodiments are rotated through 90° with respect to the power supply voltage Vdd line and ground voltage Vss line.

Figure 5:
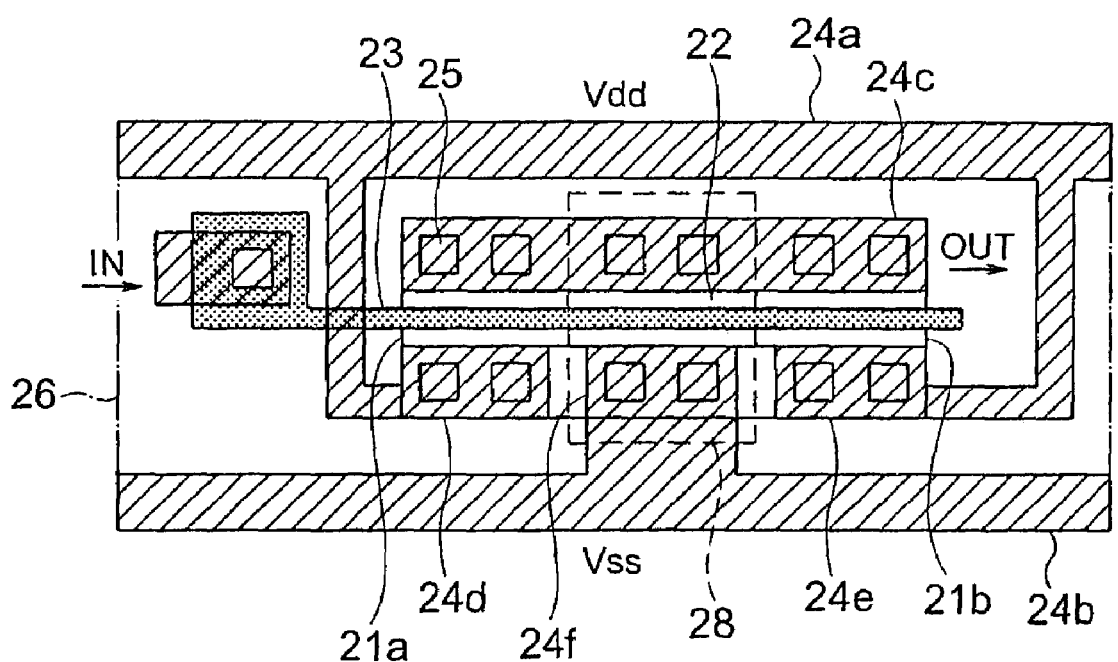
FIG. 5 is a plan view showing a layout of an inverter as a semiconductor integrated circuit according to the fourth embodiment of the present invention.

A power supply voltage Vdd line 24a and ground voltage Vss line 24b extend on the upper and lower ends of a cell region 26 along the horizontal direction in FIG. 5.

An N-type impurity region is formed using a mask having an opening region 28 in almost the middle of the cell region 26, and a P-type impurity region is formed around the region 28. An NMOS transistor region 22 is formed in the N-type impurity region, and PMOS transistor regions 21a and 21b are separately formed on the left and right sides of the region 22 in FIG. 5. A gate electrode 23 is formed on the channel regions of the PMOS transistor regions 21a and 21b and NMOS transistor region 22 through a gate insulating film. A signal IN is input to the gate electrode 23.

Wirings 24d and 24e are arranged on the source regions of the PMOS transistor regions 21a and 21b, and both are connected to a power supply voltage Vdd line 24a. The drain regions are connected to the drain region of the NMOS transistor region 22 through a wiring 24c formed above the drain regions. A wiring 24f is placed on the source region of the NMOS transistor region 22 and connected to the ground voltage Vss line 24b. The respective wirings are connected to the source or drain regions through contact holes 25.

In this embodiment, as in the second embodiment, even if mask misalignment occurs at the position of the region 28, since no change occurs in the gate width of the NMOS transistor region 22 and the sum of the gate widths of the PMOS transistor regions 21a and 21b, the integration density can be increased without degradation in transistor characteristics. As in the third embodiment described above, this embodiment facilitates connection between the PMOS transistor and NMOS transistor and the power supply voltage Vdd lines 24e and ground voltage Vss line 24b, and can reduce the area of the wirings for connection.

(5) Fifth Embodiment

Figure 6:
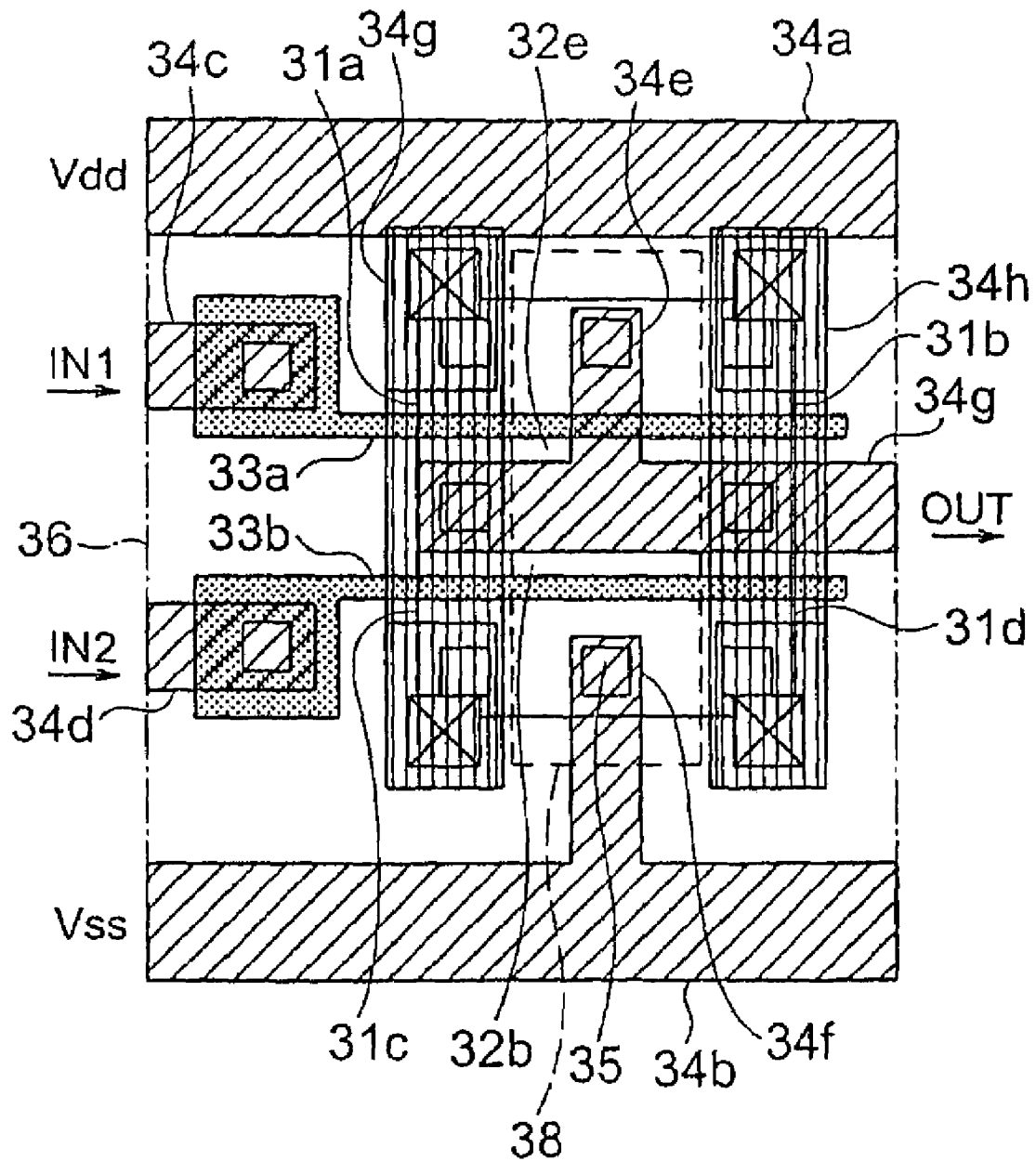
FIG. 6 is a plan view showing a layout of a 2-input NAND circuit as a semiconductor integrated circuit according to the fifth embodiment of the present invention.
Figure 12:
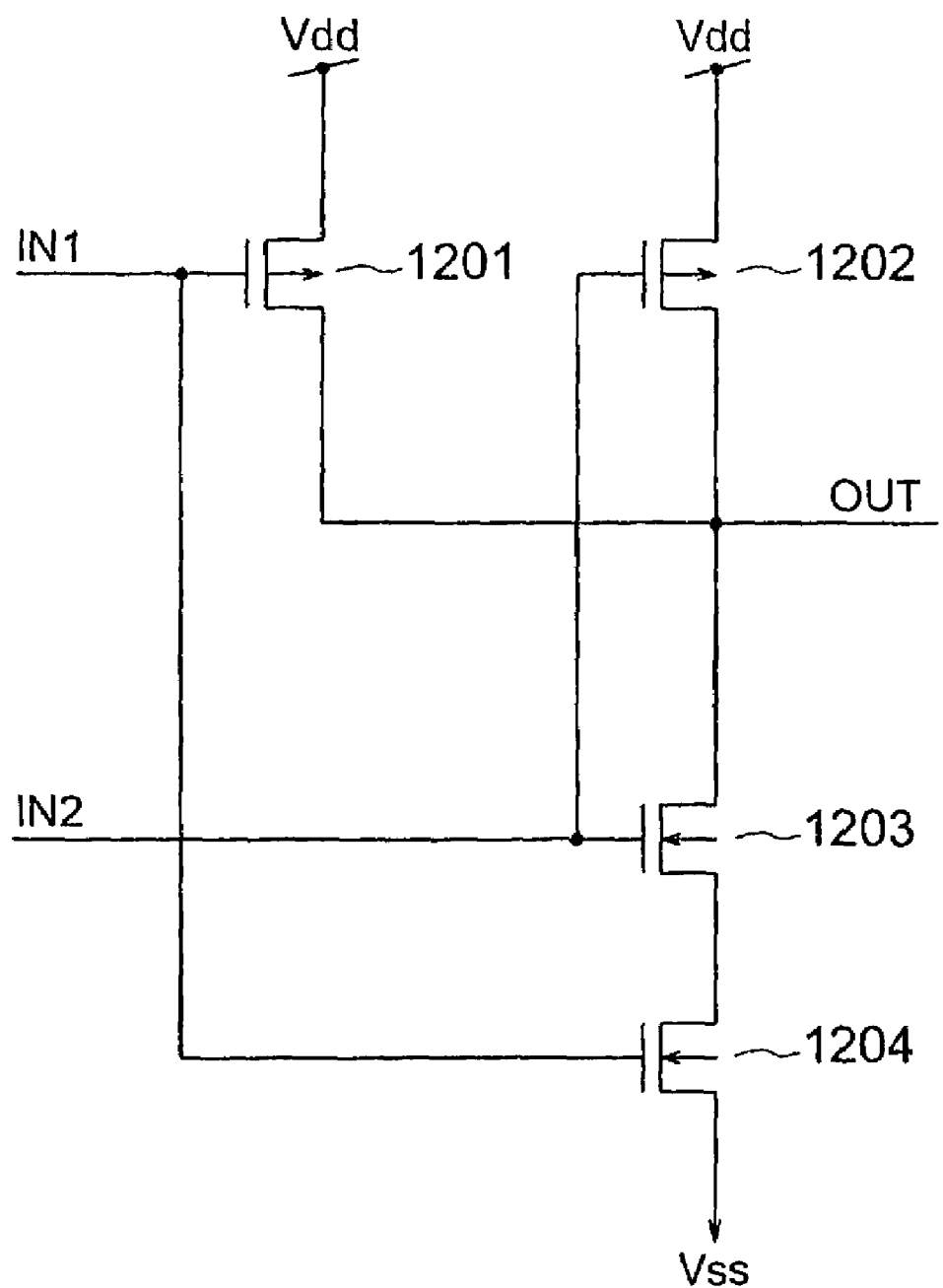
FIG. 12 is a circuit diagram showing the arrangement of a 2-input NAND circuit.
Figure 13:
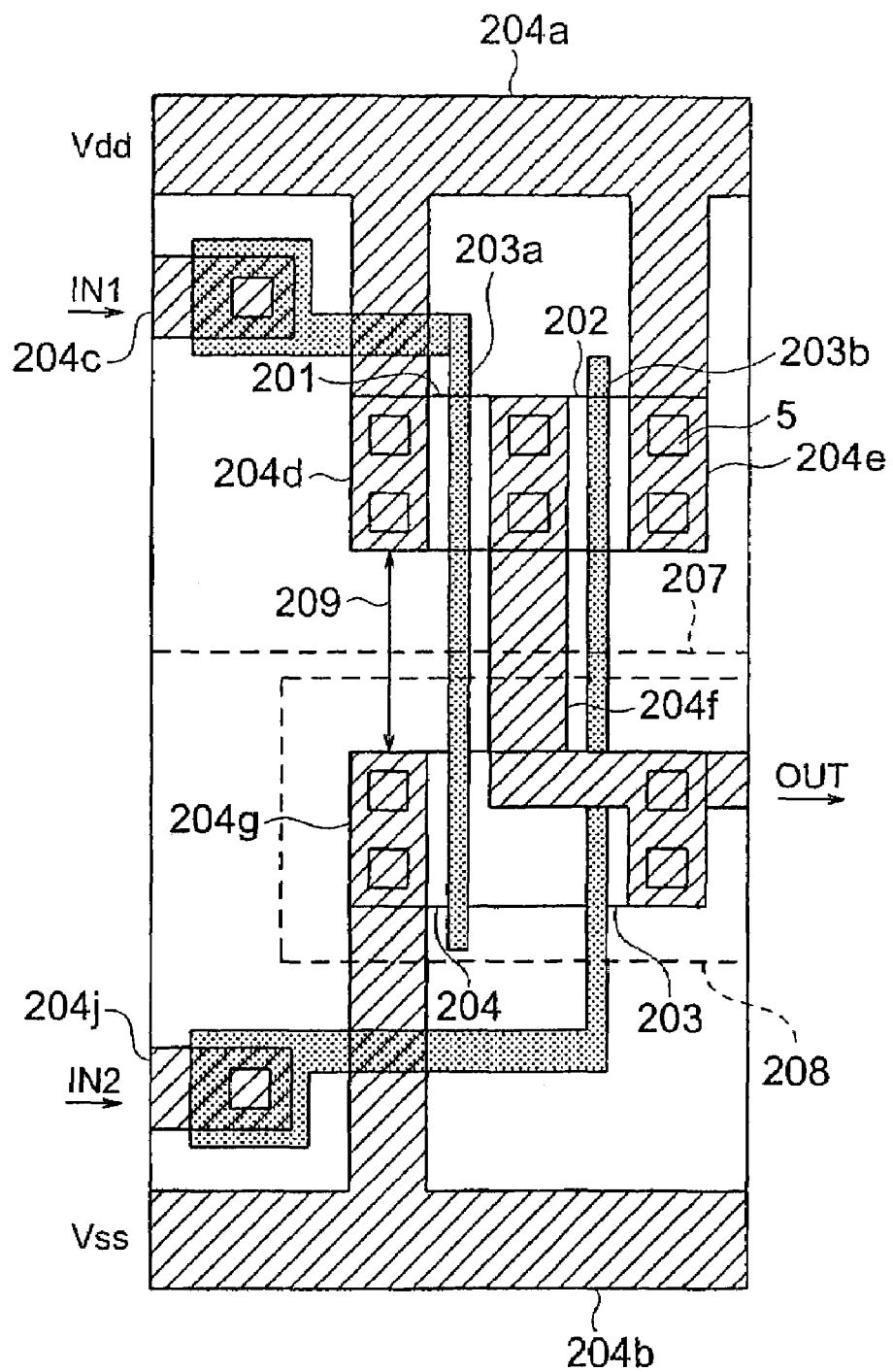
FIG. 13 is a circuit diagram showing the arrangement of a conventional 2-input NAND circuit.

The fifth embodiment of the present invention will be described below with reference to FIG. 6. This embodiment is equivalent to an arrangement in which the NAND circuit shown in FIG. 12 is applied to a standard cell. FIG. 6 shows a planar layout of this arrangement.

A power supply voltage Vdd line 34a and ground voltage Vss line 34b extend on the upper and lower ends of a cell region 36 in the horizontal direction in FIG. 6.

An N-type impurity region is formed using a mask having an opening region 28 in the cell region 36. A P-type impurity region is formed around the region 38. NMOS transistor regions 32a and 32b are arranged in the N-type impurity region. PMOS transistor regions 31a and 31b and PMOS transistors 31c and 31d are separately formed on the left and right sides of the regions 32a and 32b in FIG. 6. A gate electrode 33a is formed on the channel regions of the PMOS transistor regions 31a and 31b and NMOS transistor region 32a through a gate insulating film so as to extend across the channel regions. Likewise, a gate electrode 33b is on the channel regions of the PMOS transistor regions 31c and 31d and NMOS transistor region 32b through a gate insulating film so as to extend across the channel regions.

A wiring 34c is connected to the gate electrode 33a, to which a signal IN1 is input. A wiring 34d is connected to the gate electrode 33b, to which a signal IN2 is input.

Wirings 24d and 24e are arranged on the source regions of the PMOS transistor regions 31a, 31b, 31c, and 31d, and both are connected to the power supply voltage Vdd line 34a. The drain regions are connected, through a wiring 34g formed thereabove, to the drain region of the major surface 32a and an output terminal for outputting a signal OUT.

A wiring 34f is placed on the source region of the NMOS transistor region 32b and connected to the ground voltage Vss line 34b. Each wiring, source, and drain region are connected to each other through a contact hole 35.

According to this embodiment, even if mask misalignment occurs at the positions of the NMOS transistor regions 32a and 32b, since no change occurs in the gate width of each of the NMOS transistor regions 32a and 32b and the sum of the gate widths of the PMOS transistor regions 31a, 31b, 31c, and 31d, the integration density can be increased without degradation in transistor characteristics. In addition, this embodiment facilitates connection between the PMOS transistor and NMOS transistor and the power supply voltage Vdd line 34a and ground voltage Vss line 34b, and can reduce the area of the wirings for connection.

(6) Sixth Embodiment

The sixth embodiment of the present invention will be described below with reference to FIG. 7.

Figure 8:
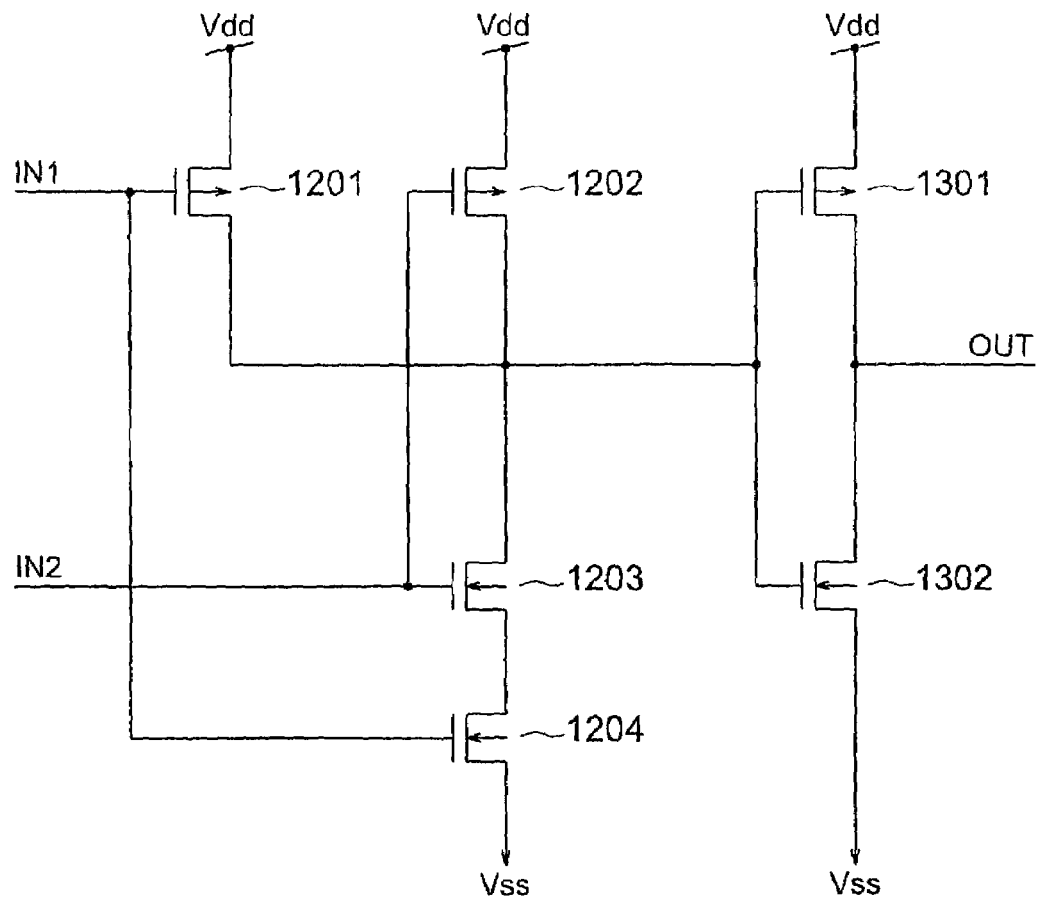
FIG. 8 is a circuit diagram showing the arrangement of the circuit having the inverter connected to the output of the 2-input NAND circuit.

This embodiment relates to a planar layout of a composite gate structure in which an inverter constituted by a PMOS transistor 1301 and NMOS transistor 1302 is connected to the output of a 2-input NAND gate constituted by PMOS transistors 1201 and 1202 and NMOS transistors 1203 and 1204 shown in FIG. 8.

Figure 7:
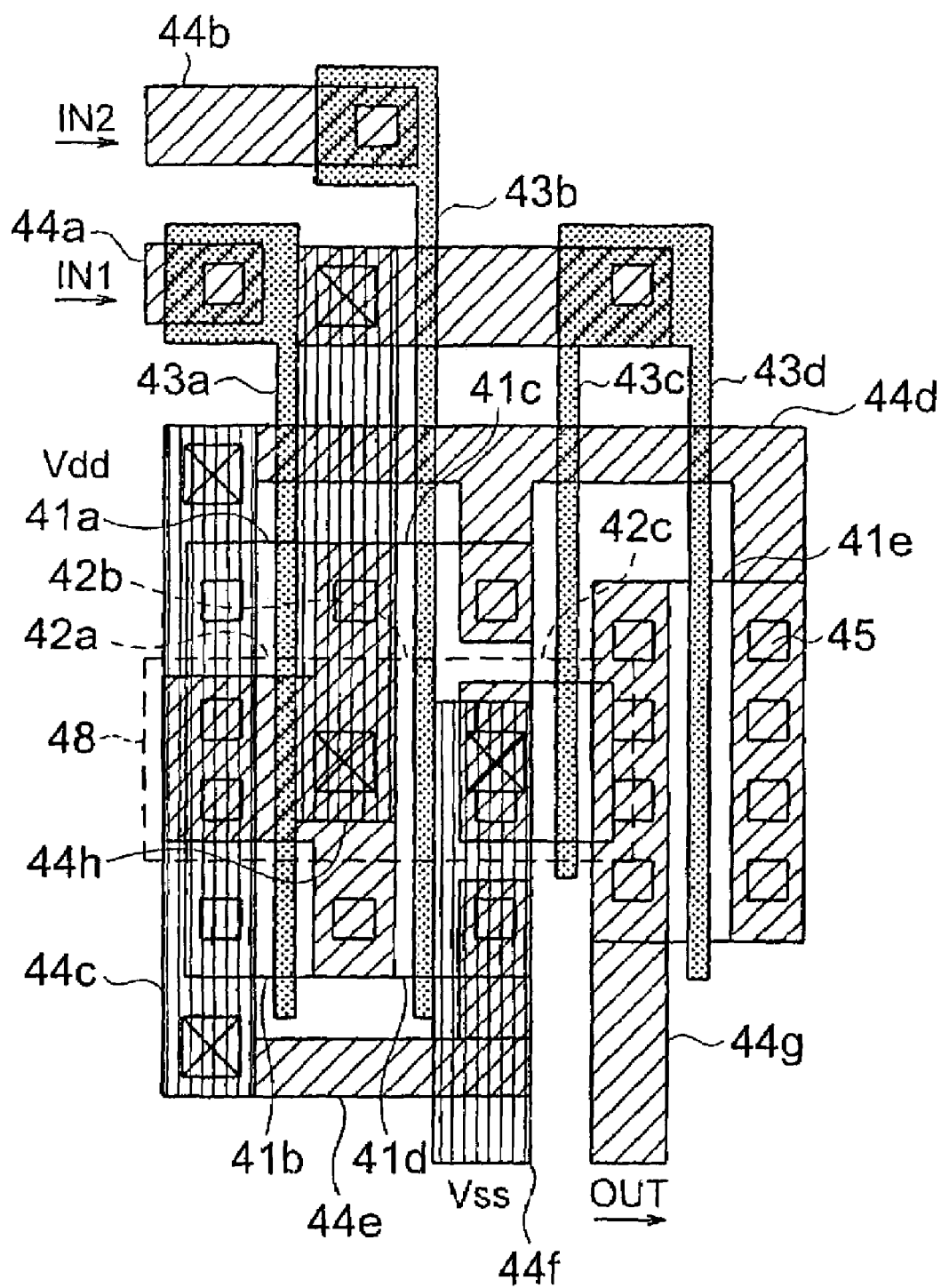
FIG. 7 is a plan view showing a layout of a circuit which has an inverter connected to the output of a 2-input NAND circuit and serves as a semiconductor integrated circuit according to the sixth embodiment of the present invention.

Gate electrodes 43a to 43d are arranged parallel in the vertical direction in FIG. 7. A wiring 44a is connected to the gate electrode 43a, to which an input signal IN1 is input. A wiring 44b is connected to the gate electrode 43b, to which an input signal IN2 is input. The gate electrodes 43c and 43d are connected to each other.

An N-type impurity region is formed using a mask having an opening region 48 in a portion where the gate electrodes 43a, 43b, and 43c exist, and a P-type impurity region is formed around the region 48. In the N-type impurity region formed by the mask having the region 48, NMOS transistor regions 42a, 42b, and 42c in which source and drain regions are arranged are formed on the two sides of each of the gate electrodes 43a, 43b, and 43c, thereby forming the NMOS transistors 1201, 1202, and 1203.

PMOS transistor regions 41a, 41b, 41c, and 41d are separately formed in twos on the upper and lower sides of the NMOS transistor regions 42a and 42b with the gate electrodes 43a and 43b serving as common electrodes, thereby forming the PMOS transistors 1203 and 1204. In addition, a PMOS transistor region 41e is formed, with the gate electrode 43d serving as a channel region, thereby forming the PMOS transistor 1301.

A power supply voltage Vdd is input to the drain regions of the PMOS transistor regions 41a, 41b, 41c, 41d, and 41e through a wiring 44d. The drain regions of the PMOS transistor regions 41a, 41b, 41c, and 41d are commonly connected to the drain region of the NMOS transistor region 42a through a wiring 44h.

A ground voltage Vss is input to the source region of the NMOS transistor region 42c through a wiring 44f. In addition, a signal OUT is output from the drain region of the PMOS transistor region 41e.

According to this embodiment, even if mask misalignment occurs at the positions of the NMOS transistor regions 34a and 34b, since no change occurs in the gate width of the NMOS transistor and the sum of the gate widths of the PMOS transistor regions 41a to 41e, the integration density can be increased without degradation in transistor characteristics.

(7) Seventh Embodiment

The seventh embodiment of the present invention will be described below with reference to FIG. 9.

This embodiment relates to a planar layout of a 2-input NAND gate having two PMOS transistors and two NMOS transistors.

Figure 9:
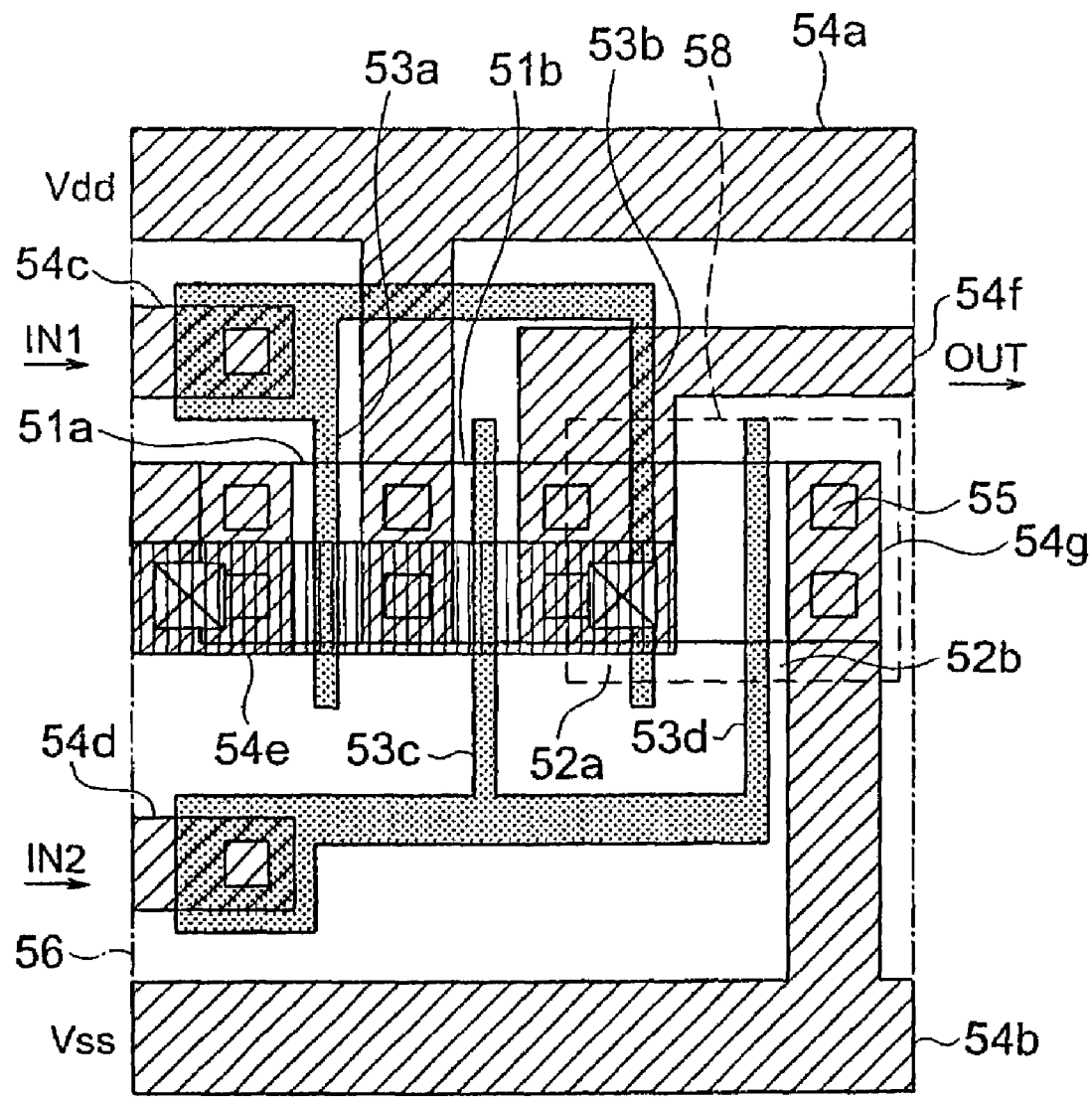
FIG. 9 is a plan view showing a layout of a circuit which has an inverter connected to the output of a 2-input NAND circuit and serves as a semiconductor integrated circuit according to the seventh embodiment of the present invention.
Figure 11:
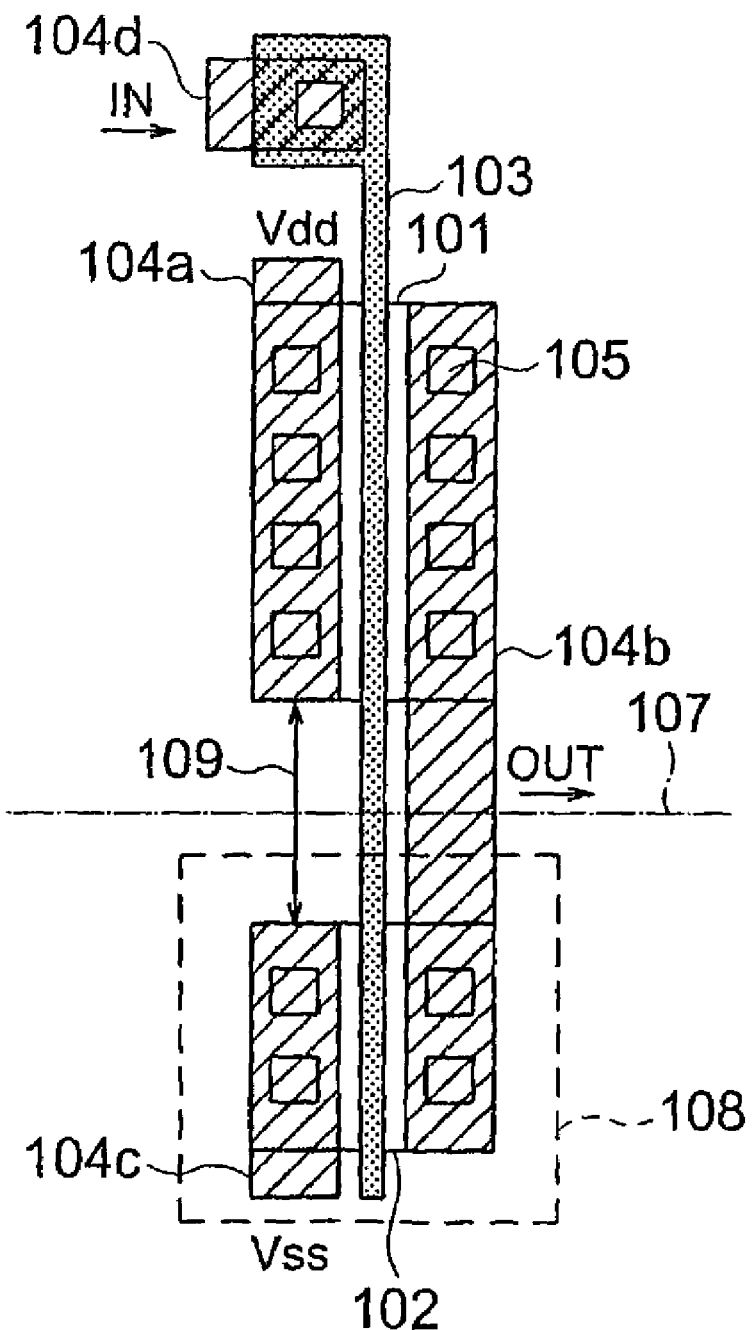
FIG. 11 is a plan view showing a layout of a conventional inverter.

A power supply voltage Vdd line 54a and ground voltage Vss line 54b extend on the upper and lower ends of a cell region 56 along the horizontal direction in FIG. 9.

Gate electrodes 53a and 53b to which a signal IN1 is input through a wiring 54c and gate electrodes 53c and 53d to which a signal IN2 is input through a wiring 54d are so arranged as to oppose each other in the form of a comb.

An N-type impurity region is formed using a mask having an opening region 58 in a portion where the gate electrodes 53b and 53d exist, and the remaining region is formed as a P-type impurity region.

The following regions are also formed in this embodiment: a PMOS transistor region 51a having the gate electrode 53a placed on the channel region, a PMOS transistor region 51b having the gate electrode 53c placed on the channel region, an NMOS transistor region 52a having the gate electrode 53b placed on the channel region, and an NMOS transistor region 52b having the gate electrode 53d placed on the channel region.

Both the source regions of the PMOS transistor regions 51a and 51b are connected to the power supply voltage Vdd line 54a through a wiring 54b.

The drain region of the PMOS transistor region 51a is connected to the gate electrode 53b of the NMOS transistor region 52a through a wiring 54e. The drain region of the PMOS transistor region 51b and the drain region of the NMOS transistor region 52a are in direct contact with each other and both are connected to a wiring 54f to output a signal OUT.

According to this embodiment, even if mask misalignment occurs at the position of the NMOS transistor region 58, since no change occurs in the gate width of the NMOS transistor regions 52a and 52b and the gate width of the PMOS transistor regions 51a to 51e, the integration density can be increased without degradation in transistor characteristics.

Each of the embodiments described above is a mere example and does not limit the present invention. In the second to sixth embodiments, PMOS transistor regions are separately arranged on the upper and lower sides of an NMOS transistor region. However, the conductivity types may be reversed to arrange NMOS transistor regions on the upper and lower sides of an PMOS transistor region.

In the first to seventh embodiments described above, on the upper and lower sides of a transistor region of one conductivity type, two transistor regions of the opposite conductivity type are separately arranged. However, two separate transistor regions of one conductivity type may be further arranged on the upper and lower sides of the transistor region of one conductivity type. FIG. 10 shows a layout of a modification of the first to seventh embodiments.

NMOS transistor regions 2a, 2b, and 2c and PMOS transistor regions 1a and 1b are arranged on a surface portion of a semiconductor substrate. An N-type impurity region ion-implanted with an N-type impurity is formed using a mask having the region 8b in almost the middle of the overall transistor region, and N-type impurity regions 8a and 8c are formed on the upper and lower sides of the region 8b at predetermined intervals. A P-type impurity is ion-implanted in the remaining region to form a P-type impurity region.

The two PMOS transistor regions 1a and 1b implanted with a P-type impurity are separately formed at the upper and lower ends of the NMOS transistor region 2b in the N-type impurity region in FIG. 10. The two separate NMOS transistor regions 2a and 2c are further formed on the upper and lower sides of the regions 1a and 1b.

The source regions of the NMOS transistor region 2a, PMOS transistor region 1a, NMOS transistor region 2b, PMOS transistor region 1b, and NMOS transistor region 2c are in direct contact with each other without any isolation regions therebetween, and so are their drain regions. In addition, a gate electrode 3 extends on the channel regions of the respective transistor regions 2a, 1a, 2b, 1b, and 2c through a gate insulating film (not shown).

With this arrangement as well, the same effects as those in the above embodiments can be obtained.

The first to seventh embodiments are equivalent to a composite gate formed from a combination of inverter circuits and/or 2-input NAND gate circuits. The present invention can also be applied to a composite gate formed from a combination of various gates, such as an NOR gate, EOR gate, and MUX gate.

As described above, a semiconductor integrated circuit according each embodiment described above has a CMOS logic gate including the first MOS transistor of the first conductivity type and the second MOS transistor of the second conductivity type. Two 2ath and 2bth MOS transistor regions are separately arranged so as to be in contact with the first and second sides of the first MOS transistor region. With this arrangement, these transistor regions of the first and second conductivity types are in direct contact with each other without being separated by isolation. This makes it possible to increase the integration density without affecting the characteristics of each MOS transistor.

What is claimed is:

1. A semiconductor integrated circuit having a CMOS logic gate including a first MOS transistor of a first conductivity type and a second MOS transistor of a second conductivity type, comprising:

a first MOS transistor region in which the first MOS transistor is formed; and a 2ath MOS transistor region and a 2bth MOS transistor region, said second MOS transistor formed in both the 2ath MOS transistor region and the 2bth MOS transistor region, the 2ath MOS transistor region arranged to be in direct contact with a first side of said first MOS transistor region with no isolation region, and the 2bth MOS transistor region separately arranged to be in direct contact with a second side opposite to the first side of said first MOS transistor region with no isolation region, wherein the first side of a source region in said first MOS transistor region is in contact with one side of a source region in said 2ath MOS transistor region, the second side of the source region in said first MOS transistor region is in contact with one side of a source region in said 2bth MOS transistor region, the first side of a drain region in said first MOS transistor region is in contact with one side of a drain region in said 2ath MOS transistor region, the second side of the drain region in said first MOS transistor region is in contact with one side of a drain region in said 2bth MOS transistor region, and a gate electrode extends above said 2ath MOS transistor region, said first MOS transistor region, and said 2bth MOS transistor region through a gate oxide film.

2. A circuit according to claim 1, further comprising a first wiring which is connected to the source region in said 2ath MOS transistor region through a first contact hole and to which a first voltage is applied, a second wiring which is connected to the source region in said 2bth MOS transistor region through a second contact hole and to which the first voltage is applied, a third wiring which is connected to the source region in said first MOS transistor region through a third contact hole and to which a second voltage is applied, and a fourth wiring commonly connected to the drain region in said first MOS transistor region, the drain region in said 2ath MOS transistor region, and the drain region in said 2bth MOS transistor region through a fourth contact hole.

3. A circuit according to claim 2, wherein said first MOS transistor region, said 2ath MOS transistor region, and said 2bth MOS transistor region are arranged in a cell region, said circuit further comprises a first power supply line which is placed along a first side of the cell region and applies the first voltage, and a second power supply line which is placed along a second side opposite to the first side and applies the second voltage, and said first and second wirings are connected to the first power supply line, and said third wiring is connected to the second power supply line.

4. A circuit according to claim 3, wherein said 2ath MOS transistor region, said first MOS transistor region, and said 2bth MOS transistor region are arranged in the cell region along a direction parallel to the first side or a direction perpendicular to the first side.

5. A circuit according to claim 2, wherein said first MOS transistor region, said 2ath MOS transistor region, and said 2bth MOS transistor region are arranged in a cell region, said circuit further comprises a 1ath power supply line which is placed along a first side of the cell region and applies the first voltage, and a 1bth power supply line which is placed along a second side opposite to the first side and applies the first voltage, and a second power supply line which is placed on said first MOS transistor region through an insulating film and applies the second voltage, and said first wiring is connected to said 1ath power supply line, said second wiring is connected to said 1bth power supply line, and said third wiring is connected to said second power supply line.

* * * * *